United States Patent
Mawet (10) Patent No.: US 7,667,506 B2
(45) Date of Patent: Feb. 23, 2010

(54) CUSTOMIZABLE POWER-ON RESET CIRCUIT BASED ON CRITICAL CIRCUIT COUNTERPARTS

(75) Inventor: Patrick H. Mawet, Snohomish, WA (US)

(73) Assignee: Mitutoyo Corporation, Kawasaki-shi (JP)

( * ) Notice: Subject to any disclaimer, the term of this patent is extended or adjusted under 35 U.S.C. 154(b) by 0 days.

(21) Appl. No.: 11/693,612

(22) Filed: Mar. 29, 2007

(65) Prior Publication Data

US 2008/0238499 A1    Oct. 2, 2008

(51) Int. Cl.
*H03L 7/00* (2006.01)

(52) U.S. Cl. ............... 327/142; 327/143; 327/198; 327/148; 323/315

(58) Field of Classification Search ............ 327/142, 327/143, 148, 198; 323/315
See application file for complete search history.

(56) References Cited

U.S. PATENT DOCUMENTS

| | | | | |
|---|---|---|---|---|
| 3,995,228 | A * | 11/1976 | Pass | 330/265 |
| 4,800,339 | A * | 1/1989 | Tanimoto et al. | 330/253 |
| 5,565,811 | A * | 10/1996 | Park et al. | 327/546 |
| 5,608,877 | A * | 3/1997 | Sung et al. | 710/104 |
| 5,847,586 | A | 12/1998 | Burstein | |
| 5,886,519 | A | 3/1999 | Masreliez | |
| 5,901,458 | A | 5/1999 | Andermo | |
| 6,191,623 | B1 * | 2/2001 | Gabara | 327/71 |
| 6,194,920 | B1 * | 2/2001 | Oguri | 327/65 |
| 6,252,442 | B1 | 6/2001 | Malherbe | |
| 6,411,647 | B1 * | 6/2002 | Chan | 375/216 |
| 6,437,614 | B1 * | 8/2002 | Chen | 327/143 |
| 6,593,790 | B2 * | 7/2003 | Kim | 327/198 |

(Continued)

FOREIGN PATENT DOCUMENTS

EP    0021289 A1    1/1981

(Continued)

OTHER PUBLICATIONS

Wikipedia—Voltage Divider http://en.wikipedia.org/wiki/Voltage_divider.*

(Continued)

*Primary Examiner*—Lincoln Donovan
*Assistant Examiner*—Brandon S Cole
(74) *Attorney, Agent, or Firm*—Christensen O'Connor Johnson Kindness PLLC (57) ABSTRACT

A power-on-reset circuit (POR) for integrated circuits that detects the minimum power levels needed to operate the most critical circuit(s) reliably. The circuit is implemented in a customized POR built into a custom IC, and emulates the critical circuit transistors in the custom IC using mimicking counterparts which are similarly affected by changes in temperature and process variations as the main circuit components. The mimicking counterparts may have smaller dimensions, to draw less current but still emulate the characteristics of the main working circuit components. Each critical sub-circuit of the main circuit may have a mimicking POR, and the multiple PORs may have their outputs combined by logic so that subtle failure modes can be modeled in the POR. The POR allows operation of the main circuit to continue at the lowest possible voltage levels while reducing the risk of unexpected results or undetected non-catastrophic failures. The POR also implements safety margins for the operation of the main circuit and tracks process sensitivity.

34 Claims, 8 Drawing Sheets

U.S. PATENT DOCUMENTS

| | | | |
|---|---|---|---|
| 6,600,350 B2 * | 7/2003 | Sekimoto et al. | 327/143 |
| 6,747,500 B2 | 6/2004 | Mawet | |
| 6,859,762 B2 | 2/2005 | Mawet | |
| 6,879,193 B2 * | 4/2005 | Okamoto et al. | 327/143 |
| 6,882,199 B2 * | 4/2005 | Sugimura | 327/198 |
| 6,982,577 B2 * | 1/2006 | Sekino et al. | 327/143 |
| 7,015,744 B1 | 3/2006 | Holloway | |
| 7,161,396 B1 | 1/2007 | Zhou | |
| 2005/0270089 A1 * | 12/2005 | Shor et al. | 327/539 |
| 2006/0012391 A1 * | 1/2006 | Huang | 324/769 |
| 2006/0145739 A1 | 7/2006 | Kim | |
| 2007/0024332 A1 * | 2/2007 | McLeod | 327/143 |
| 2007/0236840 A1 * | 10/2007 | McClure et al. | 361/18 |

FOREIGN PATENT DOCUMENTS

EP          0831589 A1     3/1998

OTHER PUBLICATIONS

Wikipedia—Inverter(Logic Gate) http://en.wikipedia.org/wiki/Inverter_%28logic_gate%29.*
Wikipedia—Differential amplifier http://en.wikipedia.org/wiki/Differential_amplifier.*
Extended European Search Report dated Aug. 6, 2008, issued in corresponding Application No. EP 08004983.6, filed Mar. 17, 2008.

* cited by examiner

CUSTOMIZABLE POWER-ON RESET CIRCUIT BASED ON CRITICAL CIRCUIT COUNTERPARTS

FIELD OF THE INVENTION

The present invention relates to low power electronic measuring instruments and, more particularly, to a power-on reset (POR) circuit which may be customized based on critical circuit counterparts in an integrated circuit (IC). The invention may be of particular utility in low voltage, low power custom IC's, such as may be used in portable measuring instruments, or the like. However, the invention is not limited to such applications.

BACKGROUND OF THE INVENTION

Various portable electronic measuring instruments are currently available for which low power utilization is an important design consideration. One example of such a device is a displacement measuring instrument, such as a hand-held electronic caliper that can be used for making precise geometric measurements, such as that shown in U.S. Pat. Nos. 5,901,458, and 5,886,519, each of which is commonly assigned and hereby incorporated by reference in its entirety. The '519 patent discloses an inductive absolute position transducer for high accuracy applications, such as linear or rotary encoders, electronic calipers and the like. Such devices may utilize low power circuits, such as those shown in U.S. Pat. Nos. 6,859,762 and 6,747,500, each of which is commonly assigned and hereby incorporated by reference in its entirety. It is obvious that the less power such instruments use, the fewer batteries (or other power sources) they will require and the longer they will operate before the batteries (or other power sources) need to be replaced or replenished. However, reducing the power requirements of such devices is a complex task. Such devices are required to make highly accurate measurements, and the signal processing techniques that have been developed for such are required to both accomplish the desired accuracy and operate at low voltage and power levels, and be relatively insensitive to reasonable variations in supply voltage and operating temperature.

When such devices are operated at low power levels, one type of circuit that may be utilized to monitor the power to make sure it is above a minimum threshold is a power-on reset (POR) circuit, such as those disclosed in U.S. Pat. Nos. 7,161,396 and 7,015,744. As described in the '396 patent, most integrated circuit devices include a power-on reset circuit that asserts a reset signal when a supply voltage is detected and then de-asserts the reset signal when the supply voltage has reached an acceptable level that is sufficient for the device's normal operation. The power-on reset circuit can also be used to assert the reset signal when the supply voltage falls below an acceptable level. When asserted, the reset signal is typically used to reset the device's internal logic to a known state. When de-asserted, the reset signal is typically used to terminate the reset operation and allow the device to commence normal operation.

Many power-on reset circuits include both a voltage based circuit and a time-delay based circuit. The voltage based circuit is intended to reset the circuit when the supply voltage is too low, by generating a reliable reset signal when a slow rising power on is encountered. It also prevents the circuit from entering an undefined state if the voltage drops, by resetting it when the supply voltage goes below a minimum threshold. In contrast, the time-delay based circuit provides a reset pulse in the case of a fast rising power on. The two outputs from the voltage-based and time-delay based circuits are combined to provide an overall reset signal.

For certain applications, different implementations of the voltage-based and time-delay based circuits may be utilized. For example, in the case of discrete systems, a fixed threshold voltage implementation may be preferred for the voltage-based circuit, in that each integrated circuit of the discrete system will typically have a specified minimum operating voltage, and the reset signal can be set according to the specified minimum operating voltages. However, one drawback of this solution is that the specified minimum operating voltage may in some cases be inaccurate, in that the actual minimum operating voltage (i.e. when the supply voltage VDD is above the threshold for reliable circuit operation), will vary with process and temperature. In such cases, if the fixed threshold voltage for triggering the reset signal is set at an incorrect level, then power inefficiencies or circuit failure may result.

The present invention is directed to a customizable power-on reset circuit that determines the minimum power levels needed to reliably operate critical circuits of an integrated circuit, such as may be included in low voltage low power devices.

SUMMARY OF THE INVENTION

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

A power-on-reset circuit (POR) for integrated circuits is provided. In accordance with one aspect of the invention, the power-on reset circuit detects the minimum power levels needed to operate the most critical sub-circuit(s) reliably. The power-on reset circuit is implemented in a custom integrated circuit, and emulates the critical circuit transistors in the main circuit using mimicking counterparts which are similarly affected by changes in temperature and process variations as the main circuit components. The mimicking counterparts may have smaller dimensions, to draw less current but still emulate the characteristics of the main working circuit components. Each critical sub-circuit of the main circuit may have a corresponding mimicking power-on reset circuit, and the multiple mimicking power-on reset circuits may have their outputs combined by logic so that subtle failure modes can be modeled in the power-on reset circuit. The power-on reset circuit allows operation of the main circuit to continue at the lowest possible voltage levels while reducing the risk of unexpected results or undetected non-catastrophic failures. The power-on reset circuit also implements safety margins for the operation of the main circuit, and tracks process sensitivity.

In accordance with another aspect of the invention, the power-on-reset circuit includes one or more mimicking transistor elements which are designed to have a current density that approximates the current density of corresponding critical sub-circuit transistor elements from the main circuit. The power-on reset circuit also includes a margin voltage drop portion (e.g. formed by one or more resistors). The mimicking transistors provide mimicking voltage drops that approximate the voltage drops across each of the corresponding critical sub-circuit transistor elements. The margin drop portion provides a margin voltage drop which provides a safety margin for the operation of the main working circuit. The total mimicking plus margin voltage drop approximates the total sub-circuit operating voltage drop plus the margin voltage drop during the operation of the integrated circuit.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1:
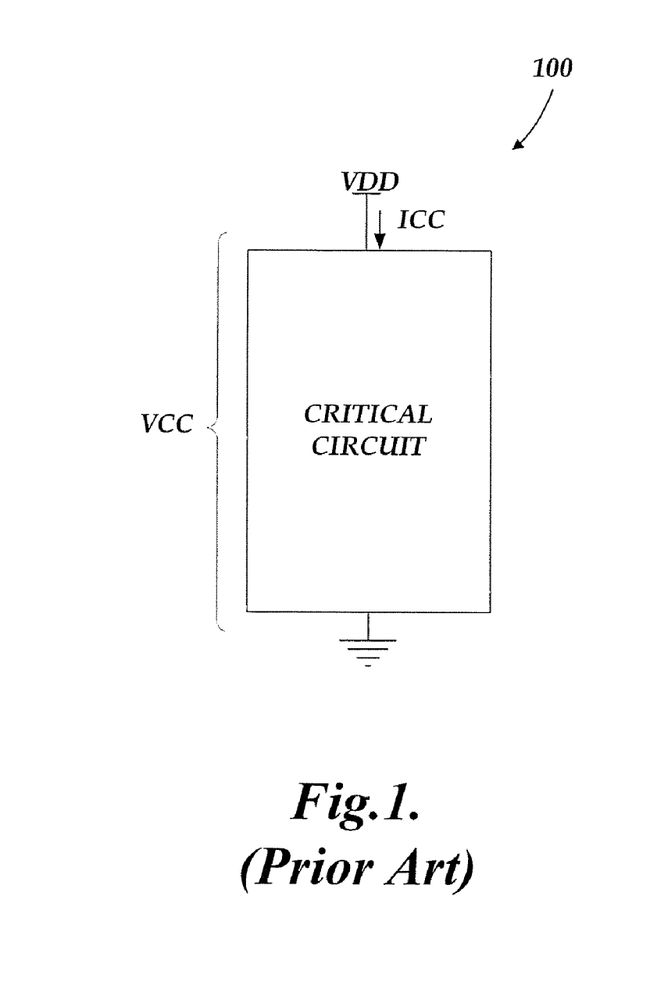
FIG. 1 is a block diagram of a generic prior art circuit which performs critical operations and which may be modeled by a power-on reset circuit in accordance with the present invention.

FIG. 1 is a block diagram of a generic prior art circuit 100 which performs critical operations and which may be modeled by a power-on reset circuit in accordance with the present invention. The critical circuit 100 may be part of a larger circuit on an integrated circuit chip. As will be described in more detail below, the critical circuit 100 is presumed to include one or more critical sub-circuit transistor elements (not shown) which in combination draw a current ICC. A voltage drop VCC occurs across the critical circuit 100. As will be described in more detail below with respect to FIG. 3, the critical circuit 100 may have a minimum desired operating voltage for reliable circuit operation. As process and temperature changes occur, the minimum desired operating voltage for the circuit 100 may change. As will be described in more detail below, in accordance with the present invention a power-on reset circuit may be provided which mimics these changes and thus allows the circuit to continue reliable operation at the most energy efficient levels.

More generally, when a custom integrated circuit is being utilized for which a power-on reset circuit is being designed, it is advantageous to detect a reset condition by determining an actual desired operating voltage for the critical circuit, which may vary with process and temperature. In other words, the minimum operating voltage specified by the manufacturer of the integrated circuit chip may be inaccurate depending on the changes in the operating characteristics of the circuit components, which may vary with process and temperature. By tracking the actual minimum desired operating voltage as it varies with process and temperature, greater energy efficiencies may be achieved in that the critical circuits will be allowed to operate at their true lowest acceptable power levels. In addition, the system is made more robust in that the specifications designated by the manufacturer may not have sufficient safety margins for certain operating conditions (e.g. extreme temperatures or process variations) in which case circuit failure may be avoided by mimicking the actual minimum desired operating voltage.

As will be described in more detail below with respect to FIGS. 2-10, various embodiments of power-on reset circuits of increasing complexity may be provided. As an overall summary of the design principles for the various embodiments, a power-on reset circuit formed in accordance with the present invention mimics the minimum desired operating voltage of the critical circuit 100 in the following manner. The critical circuit 100 is presumed to include one or more critical sub-circuit transistor elements. For each critical sub-circuit transistor element, the power-on reset circuit may include a mimic transistor element designed to have a current density that approximates a current density of the corresponding critical sub-circuit transistor element. In other words, the mimic transistor element is designed to mimic the corresponding critical sub-circuit transistor element, such that for a similar supply voltage VDD, the transistors will become operational at a similar time, and the mimic transistor element may therefore be utilized to mimic the actual desired minimum operating voltage of the corresponding critical sub-circuit transistor element. Furthermore, because both the critical circuit 100 and the power-on reset circuit are implemented in the same custom integrated circuit, temperature changes and process variations will similarly affect the components in both circuits, and will therefore cause similar changes in the voltage/current characteristics of the transistors. The mimic transistor elements thus mimic the operations of the corresponding critical sub-circuit transistor elements. In one embodiment, the mimic transistor elements may be sized with a lower W/L ratio than the corresponding critical sub-circuit transistor elements, so as to limit the current drain in the power-on reset circuit. Various implementations of power-on reset circuits of increasing complexity will be described in more detail below with reference to FIGS. 2-10.

Figure 2:
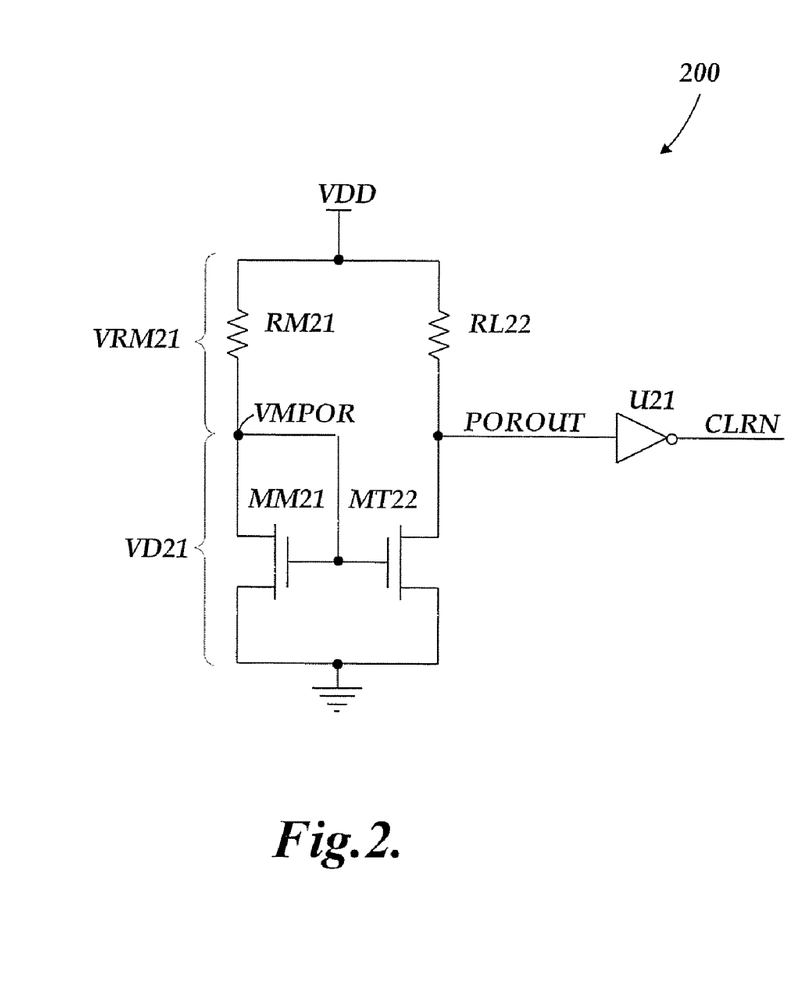
FIG. 2 is a schematic diagram of a power-on reset circuit which models a critical circuit with a single NMOS transistor.

FIG. 2 is a schematic diagram of a power-on reset circuit 200 with a mimic NMOS transistor MM21 which models a critical circuit with a single NMOS transistor. As will be described in more detail below, the power-on reset circuit 200 is designed to ensure that the power supply voltage VDD is high enough that the mimic transistor MM21 will operate with a certain current. For example, this could be used to ensure that all NMOS transistors in digital gates in the critical circuit 100 are capable of a minimum drive strength. To minimize the current drain in the power-on reset circuit 200, in one embodiment the mimic transistor MM21 can be sized with a lower W/L ratio than a corresponding transistor in the critical circuit 100, with the current densities still being the same.

As shown in FIG. 2, the power-on reset circuit 200 includes a margin resistor RM21, a load resistor RL22, a mimic transistor MM21, a mirror transistor MT22 and an output component U21. The mimic transistor MM21 and the mirror transistor MT22 are both NMOS type transistors. The output component U21 may in various embodiments be an element such as an inverter or a Schmidt Trigger, as will be described in more detail below.

As shown in FIG. 2, on the left side of the circuit 200, the margin resistor RM21 is coupled in series with the mimic transistor MM21 between the power supply VDD and ground. The circuit node between the margin resistor RM21 and the mimic transistor MM21 has a mimic voltage VMPOR and is coupled to the gate of the mimic transistor MM21. A margin voltage drop VRM21 occurs across the margin resistor RM21, while a mimic voltage drop VD21 occurs across the mimic transistor MM21.

On the right side of the circuit 200, the load resistor RL22 and the mirror transistor MT22 are coupled in series between the power supply VDD and ground. The gate of the mirror transistor MT22 is coupled to the gate of the mimic transistor MM21. The circuit node between the load resistor RL22 and the mirror transistor MT22 is used for an output for the power-on reset circuit 200 in the form of an output signal POROUT. The output component U21 receives the signal POROUT and outputs the reset signal CLRN which is utilized to reset the critical circuit 100, as described above. In this description, all the reset signal outputs (CLRN) will be designated as being active low, as is commonly used.

In one embodiment, the values of the components of the power-on reset circuit 200 may be selected in accordance with certain desired design parameters. More specifically, certain equations may be utilized to determine the desired component values. For example, for reliable circuit operation a desired operating current $ID_1$ may be designated as flowing through the margin resistor RM21 and the mimic transistor MM21. The margin resistor RM21 limits the current when the power supply voltage VDD increases, thus conserving power, and can also be sized to provide certain operating margins, as will be described in more detail below. The equation for sizing the margin resistor RM21 is:

$$VDD_0 = VGS_1 + ID_1 \cdot RM21 \quad \text{(Eq. 1)}$$

Where the voltage $VDD_0$ is the supply voltage at the trip point under nominal conditions, and the voltage $VGS_1$ is the expected operating gate-source voltage of the mimic transistor MM21 at a corresponding current $ID_1$. As a specific example, if it is desired to have a 1 uA current as the minimum operating condition, with a margin of 100 mV on the power supply voltage VDD, the gate voltage $V_{GS1}$ of the mimic transistor MM21 at that current is expected to be about 1V. The value of the margin resistor RM21 will be 100K, and $VDD_0 = 1.1V$.

The current $ID_1$ is mirrored by the mirror transistor MT22 and drives the load resistor RL22. The output component U21 may be an inverter, or in one embodiment preferably a Schmidt Trigger, which will trip around VDD/2. When designing the output component U21, it is important that it be able to operate at voltages lower than $VDD_0$. That means that it will in some implementations use transistors wider than the mimic transistor MM21 so it can operate effectively in weak inversion at very low voltages. The load resistor RL22 can be sized to give:

$$VIN = VDD_0 - RL22 \cdot ID_1 = \frac{VDD_0}{2} \quad \text{(Eq. 2)}$$

Or, $$RL22 = \frac{VDD_0}{2 \cdot ID_1} \quad \text{(Eq. 3)}$$

or RL22=550K in the above example. This circuit will reset for voltages lower than 1.1V ($VDD_0$) under nominal conditions, and adjust as the gate voltage $V_{GS1}$ of the mimic transistor MM21 changes with process and temperature.

Figure 3:
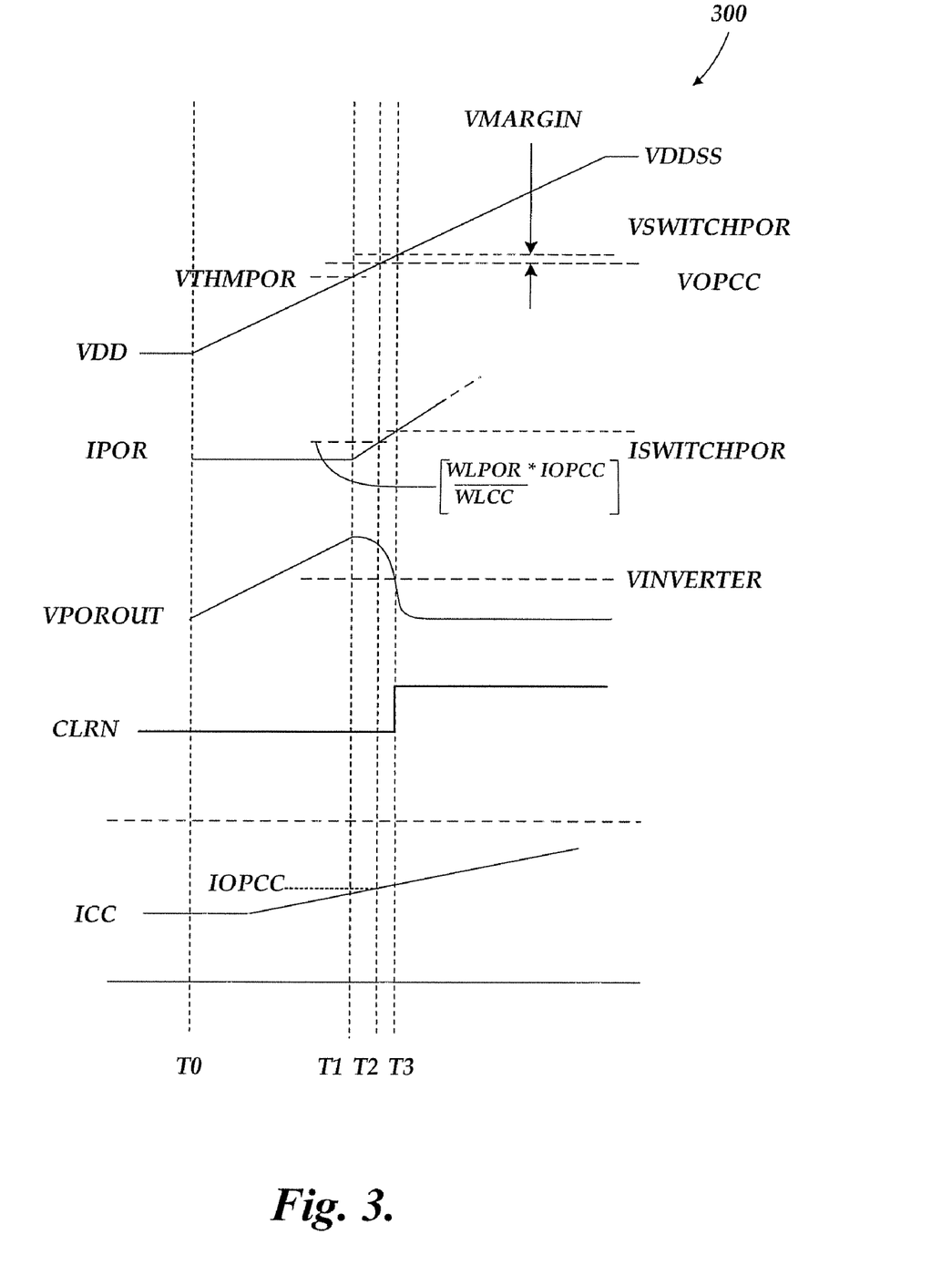
FIG. 3 is a timing diagram illustrating certain aspects of the operation of the power-on reset circuit of FIG. 2.

FIG. 3 is a timing diagram 300 illustrating certain aspects of the operation of the power-on reset circuit 200 of FIG. 2, with a slowly rising supply voltage. It will be appreciated that for clarity of illustration, the relationships between various timings and voltages shown in the diagram 300 are not necessarily to scale. As shown in FIG. 3, the timing for various signals is illustrated, including a power supply voltage VDD, a power-on-reset circuit current IPOR, an output voltage VPOROUT, a reset signal CLRN, and a modeled critical circuit current ICC. At a time T0, all of the signals are at their initial states. Starting at the time T0, the power supply is turned on or connected and the power supply voltage VDD begins to ramp up in a linear fashion. The increase in the power supply voltage VDD causes a corresponding increase in the output voltage VPOROUT from the power-on-reset circuit 200. After a certain interval, the modeled critical circuit current ICC also starts to increase relatively linearly.

At a time T1, the power supply voltage VDD reaches a threshold voltage VTHMPOR for turning on the mimic transistor MM21 of the power-on-reset circuit 200. This causes the current IPOR through the power-on-reset circuit 200 to begin increasing in a somewhat linear fashion. In addition, the output voltage VPOROUT begins declining as current begins to flow through the mirror transistor MT22.

At a time T2, the power supply voltage VDD reaches a voltage level VOPCC, which is a desired operating voltage for the critical circuit 100. In addition, the corresponding modeled current ICC of the critical circuit 100 reaches a desired operating current level IOPCC for reliable circuit operation. While the desired operating levels for the critical circuit 100 are thus reached at the time T2, as will be described in more detail below, an additional safety margin is implemented which does not allow the critical circuit 100 to become operational until a time T3.

At the time T3, the power supply voltage VDD reaches a voltage level VSWITCHPOR for switching the reset signal CLRN, as will be described in more detail below. The difference between the voltage level VOPCC for the desired operating voltage of the critical circuit 100 and the voltage level VSWITCHPOR at which the power-on-reset circuit 200 actually switches the reset signal CLRN, is the margin voltage VMARGIN. The margin voltage VMARGIN is utilized to address issues such as potential mismatches in the integrated circuit. As shown at time T3, once the power supply voltage VDD reaches the voltage level VSWITCHPOR, the current IPOR in the power-on-reset circuit 200 reaches a threshold current level ISWITCHPOR, which is a sufficient current for switching the output component U21, and the output voltage VPOROUT reaches the threshold voltage level VIN-VERTER, at which the output component U21 switches. The switching of the output component U21 causes the reset signal CLRN to go high, which thus enables the critical circuit 100 to enter a normal operating mode. It will be appreciated that if the steady state level of a power supply voltage is low, such that the power supply voltage VDD never reaches the voltage level VSWITCHPOR, then the reset signal CLRN will remain low, indicating a failure condition and/or inhibiting operation of the critical circuit.

Figure 4:
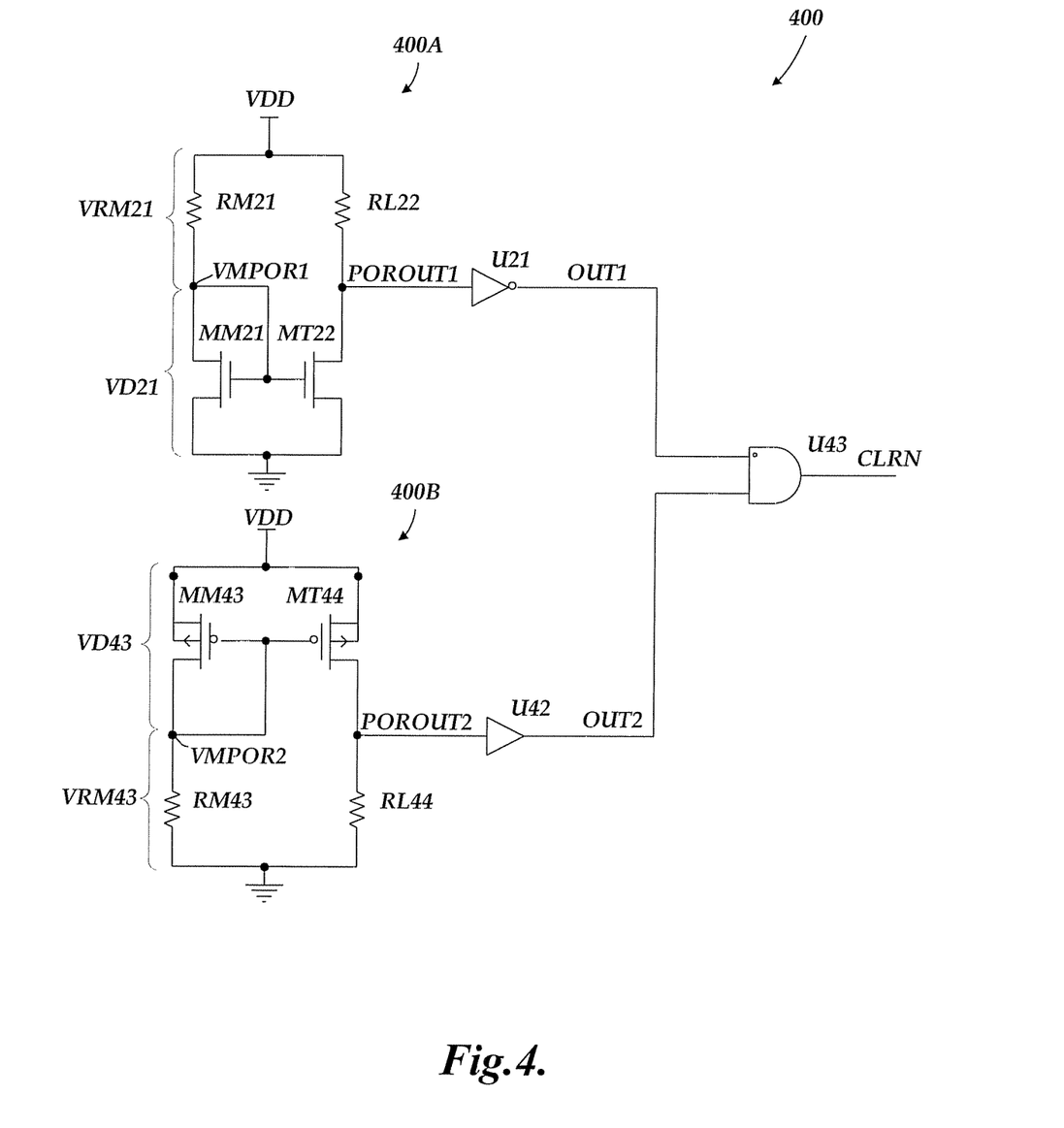
FIG. 4 is a schematic diagram of a power-on reset circuit which models a critical circuit with both NMOS and PMOS transistors.

FIG. 4 is a schematic diagram of a power-on reset circuit 400 for a critical circuit with both NMOS and PMOS transistors. The circuit 200 of FIG. 2 described above only addresses NMOS transistors, which in certain implementations may not be sufficient for typical CMOS circuits. In contrast, FIG. 4 shows a power-on reset circuit 400 with two circuits 400A and 400B, one with NMOS transistors and one with PMOS transistors. The two outputs OUT1 and OUT2 of the circuits 400A and 400B are gated with an AND gate to provide the reset signal CLRN. The PMOS and NMOS circuits 400A and 400B can be designed to ensure a minimum operating current density in the CMOS digital gates of a critical circuit, which results in ensuring a minimum operating speed.

The NMOS circuit 400A is similar to the circuit 200 of FIG. 2, and contains similarly numbered components which are connected and operate in a similar fashion as was described above. For the output of the circuit 400A, the circuit node between the load resistor RL22 and the mirror transistor MT22 provides the output signal POROUT1. The output component U21 receives the signal POROUT1 and outputs a signal OUT1.

The PMOS circuit 400B is formed similar to the NMOS circuit 400A, except generally reversed as is known for PMOS circuitry. More specifically, the PMOS circuit 400B includes a margin resistor RM43, a load resistor RL44, a mimic transistor MM43, a mirror transistor MT44, and an output component U42. On the left side of the circuit 400B, the mimic transistor MM43 and the margin resistor RM43 are coupled in series between the power supply VDD and ground. The circuit node between the mimic transistor MM43 and the margin resistor RM43 is coupled to the gate of the mimic transistor MM43, and has a voltage level VMPOR2. A mimic voltage drop VD43 occurs across the mimic transistor MM43, while a margin voltage drop VRM43 occurs across the margin resistor RM43.

On the right side of the circuit 400B, the mirror transistor MT44 and the load resistor RL44 are coupled in series between the power supply VDD and ground. The gate of the mirror transistor MT44 is coupled to the gate of the mimic transistor MM43. The circuit node between the mirror transistor MT44 and the load resistor RL44 provides an output signal POROUT2. The output component U42 receives the signal POROUT2 and outputs a signal OUT2. As noted above, the output signal OUT1 from the NMOS circuit 400A and the output signal OUT2 from the PMOS circuit 400B are combined by the AND gate U43 to produce the reset signal CLRN.

Figure 5:
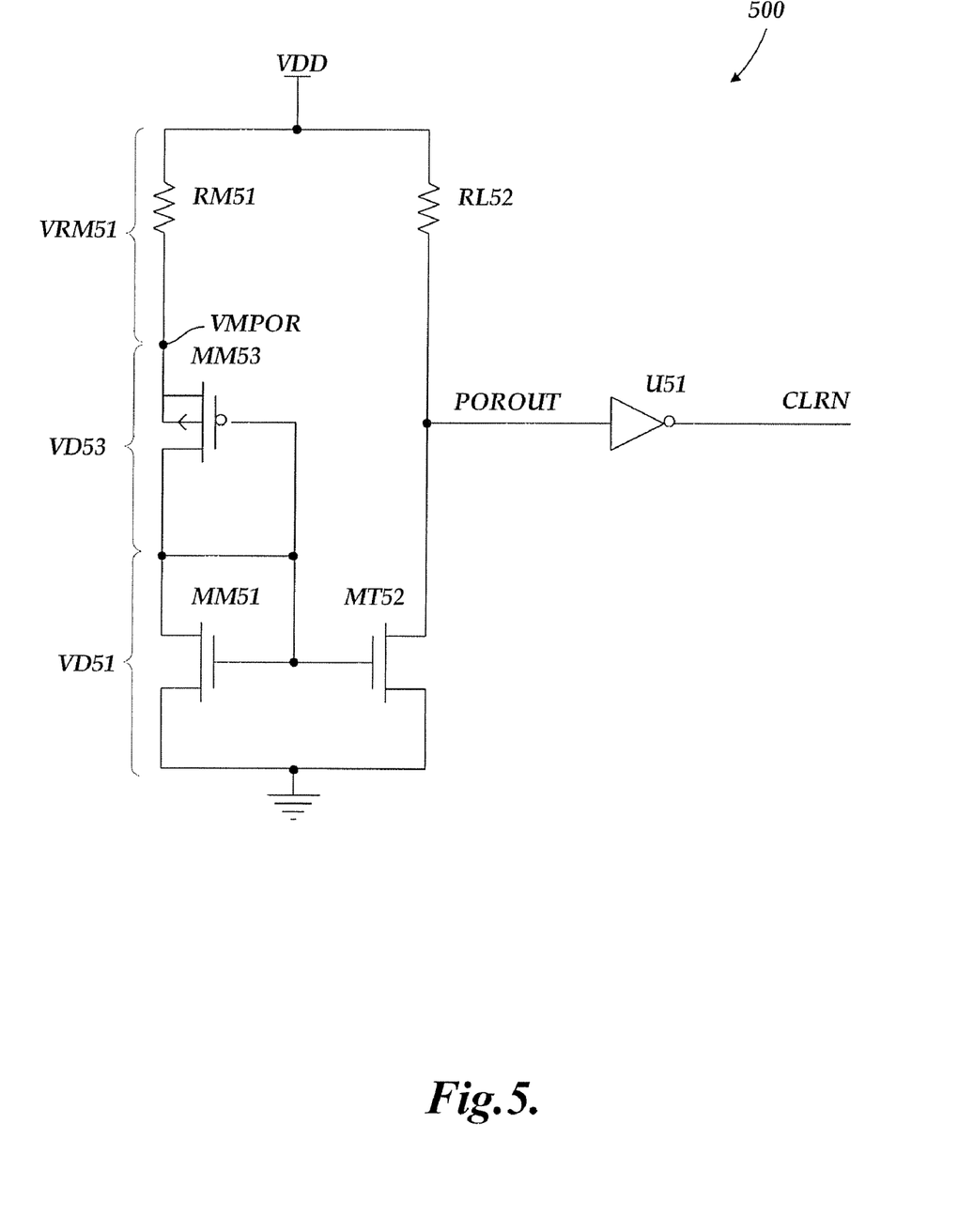
FIG. 5 is a schematic diagram of a power-on reset circuit which models a critical circuit with a CMOS inverter.

FIG. 5 is a schematic diagram of a power-on reset circuit 500 for a critical circuit with a CMOS inverter. In one embodiment, the circuit 500 may be considered to utilize a more conservative approach than the circuit 400 of FIG. 4, in that in the circuit 500 the PMOS and NMOS transistors are combined in an inverter configuration. This ensures that the supply voltage VDD is at least greater than the sum of the operating gate to source voltages of both the PMOS and NMOS transistors of the circuit 500. This is more conservative than what is needed to guarantee the operation of digital circuits, and has the advantage of being a suitable condition for certain implementations of more complex digital and analog circuits.

As shown in FIG. 5, the power-on reset circuit 500 includes a margin resistor RM51, a load resistor RL52, a mimic transistor MM51, a mirror transistor MT52, a mimic transistor MM53, and an output component U51. The mimic transistor MM51 and the mirror transistor MT52 are NMOS type transistors, while the mimic transistor MM53 is a PMOS type transistor. On the left side of the circuit 500, the margin resistor RM51, the mimic transistor MM53 and the mimic transistor MM51 are coupled in series between the power supply VDD and ground. The circuit node between the margin resistor RM51 and the mimic transistor MM53 has a voltage VMPOR. The circuit node between the mimic transistor MM53 and the mimic transistor MM51 is coupled to the gates of the mimic transistor MM51 and the mimic transistor MM53. A margin voltage drop VRM51 occurs across the margin resistor RM51, while a mimic voltage drop VD 53 occurs across the mimic transistor MM53, and a mimic voltage drop VD51 occurs across the mimic transistor MM51.

On the right side of the circuit 500, the load resistor RL52 and the mirror transistor MT52 are coupled in series between the power supply VDD and ground. The gate of the mirror transistor MT52 is coupled to the gate of the mimic transistor MM51. The circuit node between the load resistor RL52 and the mirror transistor MT52 provides an output signal POROUT. The output component U51 receives the signal POROUT and outputs the reset signal CLRN.

Figure 6:
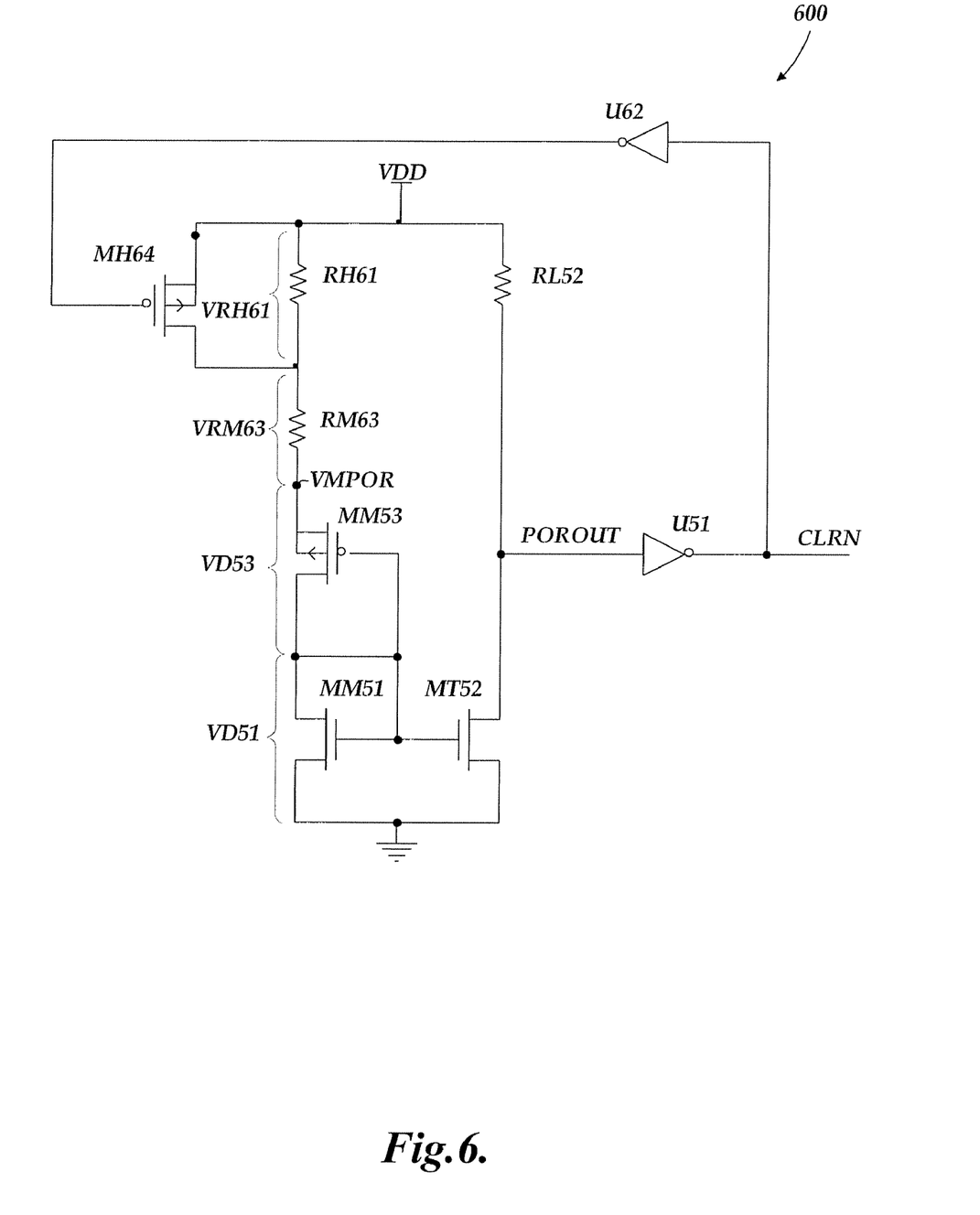
FIG. 6 is a schematic diagram of the power-on reset circuit of FIG. 5 with the addition of hysteresis components.

FIG. 6 is a schematic diagram of a power-on reset circuit 600 including the power-on reset circuit 500 of FIG. 5 with the addition of hysteresis components. The hysteresis components are utilized to create two thresholds. More specifically, when the power supply voltage VDD slowly rises, the circuit 600 will trip at a higher voltage than when it is falling. This means that the 'turn-on' condition may have an additional margin, where the 'brownout' condition (for a power supply voltage VDD drop when the circuit is already on) may be set at the lowest safe operating voltage.

As shown in FIG. 6, the power-on reset circuit 600 includes all of the components of the circuit 500, with the addition of certain hysteresis components. More specifically, the margin resistor RM51 of the circuit 500 has been divided into a hysteresis resistor RH61 and a margin resistor RM63 in the circuit 600. In addition, the circuit 600 further includes a hysteresis transistor MH64 and a hysteresis inverter U62.

The hysteresis resistor RH61 and the margin resistor RM63 are coupled in series between the power supply VDD and the mimic transistor MM53. The hysteresis transistor MH64 is coupled in parallel with the hysteresis resistor RH61. The gate of the hysteresis transistor MH64 is coupled to the output of the hysteresis inverter U62, which receives as an input the reset signal CLRN. A hysteresis voltage drop VRH61 occurs across the hysteresis resistor RH61, while a margin voltage drop VRM63 occurs across the margin resistor RM63.

Figure 7:
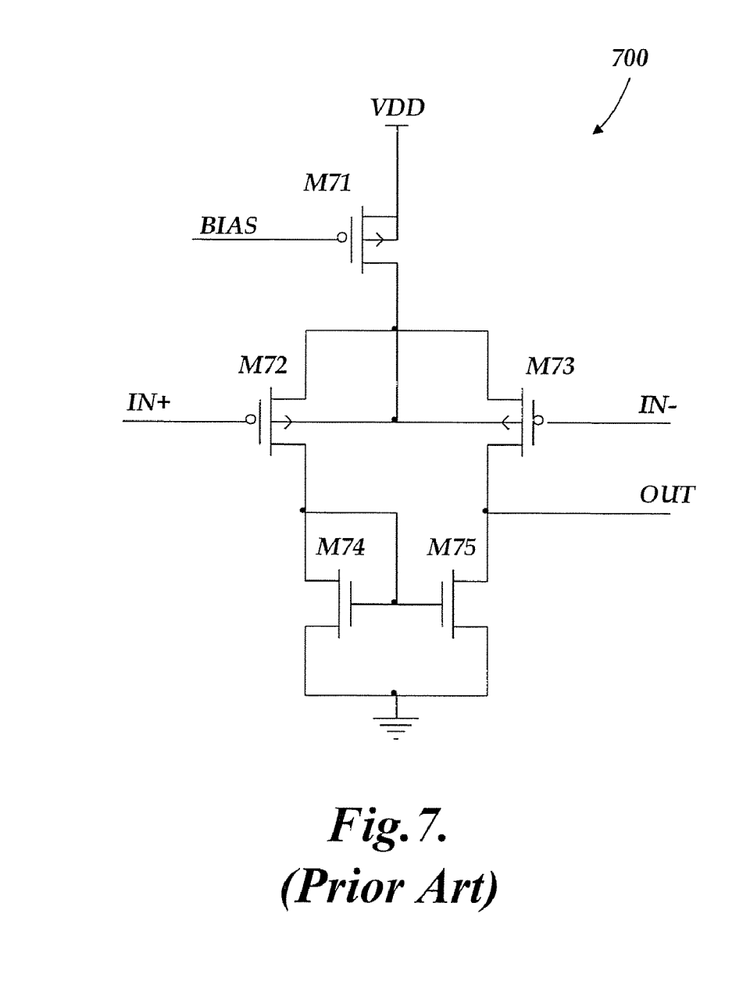
FIG. 7 is a schematic diagram of a prior art single stage op-amp circuit which may be modeled by a power-on reset circuit in accordance with the present invention.

FIG. 7 is a schematic diagram of a prior art single stage op-amp circuit 700 which may be modeled with a power-on reset circuit in accordance with the present invention, as will be described in more detail below with respect to FIG. 8. As shown in FIG. 7, the op-amp circuit 700 includes transistors M71, M72, M73, M74 and M75. The transistors M71, M72 and M73 are PMOS type transistors, while the transistors M74 and M75 are NMOS type transistors. The source and body of the transistor M71 are coupled to the power supply VDD, while the drain is coupled to a circuit node between the sources of the transistors M72 and M73, and to the bodies of the transistors M72 and M73. The drain of the transistor M72 is coupled to the drain of the transistor M74, while the drain of the transistor M73 is coupled to the drain of the transistor M75. The gates of the transistors M74 and M75 are coupled to the circuit node between the transistor M72 and the transistor M74. The sources of the transistors M74 and M75 are coupled to ground. The gate of the transistor M71 receives a signal BIAS, while the gate of the transistor M72 receives a signal IN+, and the gate of the transistor M73 receives a signal IN−. The circuit node between the transistor M73 and the transistor M75 provides an output signal OUT.

Figure 8:
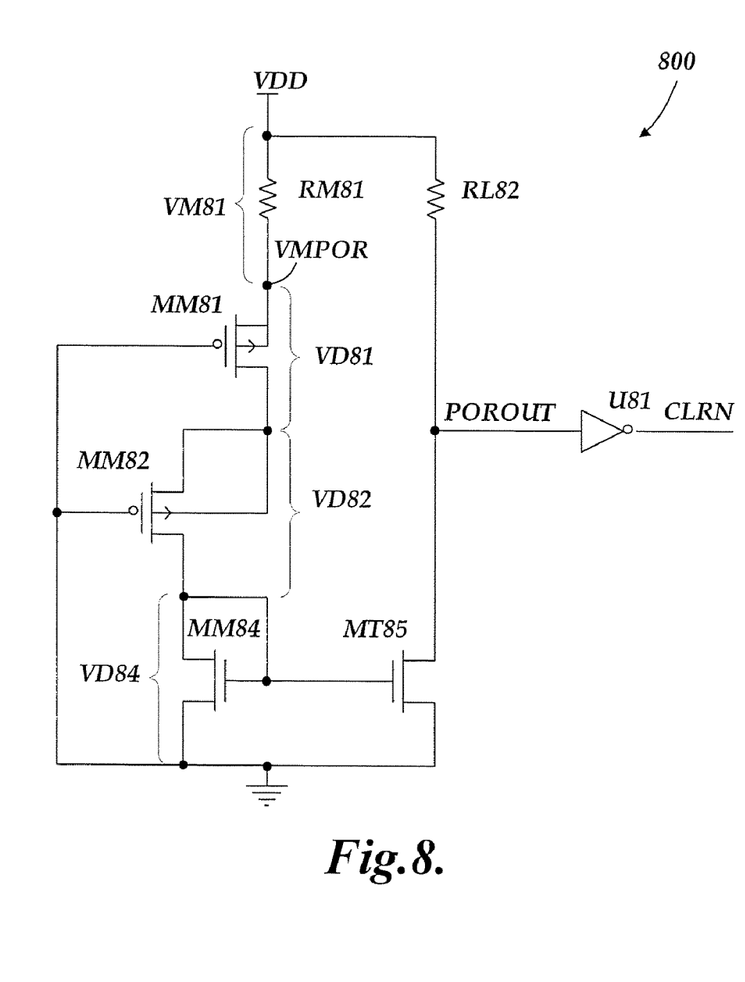
FIG. 8 is a schematic diagram of a power-on reset circuit which models the single stage op-amp circuit of FIG. 7.

FIG. 8 is a schematic diagram of a power-on reset circuit 800 for the critical single stage op-amp circuit of FIG. 7. In the power-on reset circuit 800, a set of transistors MM81, MM82 and MM84 reproduce the basic structure of the op-amp circuit 700. For the op-amp circuit 700 to operate, the supply voltage VDD needs to be high enough to supply the gate voltage of the transistor MM81, and the drain-source voltages of the transistors MM82 and MM84 at the desired current. In one implementation, such a circuit may have a limited range, but provision for the minimum desired range may be included in the voltage margin provided by the voltage drop across a resistor RM81.

As shown in FIG. 8, the power-on reset circuit 800 includes the margin resistor RM81, a load resistor RL82, the mimic transistors MM81, MM82, MM84, a mirror transistor MT85, and an output component U81. The mimic transistors MM81 and MM82 are PMOS type transistors, while the mimic transistor MM84 and the mirror transistor MT85 are NMOS type transistors. On the left side of the circuit 800, the margin resistor RM81 and the mimic transistors MM81, MM82 and MM84 are all coupled in series between the power supply VDD and ground. The circuit node between the margin resistor RM81 and the mimic transistor MM81 has a voltage VMPOR. The gates of the mimic transistors MM81 and MM82 are coupled to ground. The body of the mimic transistor MM81 is coupled to its source. The drain of the mimic transistor MM81 is coupled to the source and body of the mimic transistor MM82. The drain of the mimic transistor MM82 is coupled to the drain of the mimic transistor MM84. The gate of the mimic transistor MM84 is coupled to the circuit node between the mimic transistors MM82 and MM84. A margin voltage drop VM81 occurs across the margin resistor RM81, while a mimic voltage drop VD81 occurs across the mimic transistor MM81, and a mimic voltage drop VD82 occurs across the mimic transistor MM82, and a mimic voltage drop VD84 occurs across the mimic transistor MM84.

On the right side of the circuit 800, the load resistor RL82 and the mirror transistor MT85 are coupled in series between the power supply VDD and ground. The gate of the mirror transistor MT85 is coupled to the gate of the mimic transistor MM84. The circuit node between the load resistor RL82 and the mirror transistor MT85 provides the output signal POROUT. The output component U81 receives the signal POROUT and provides the reset signal CLRN.

Figure 9:
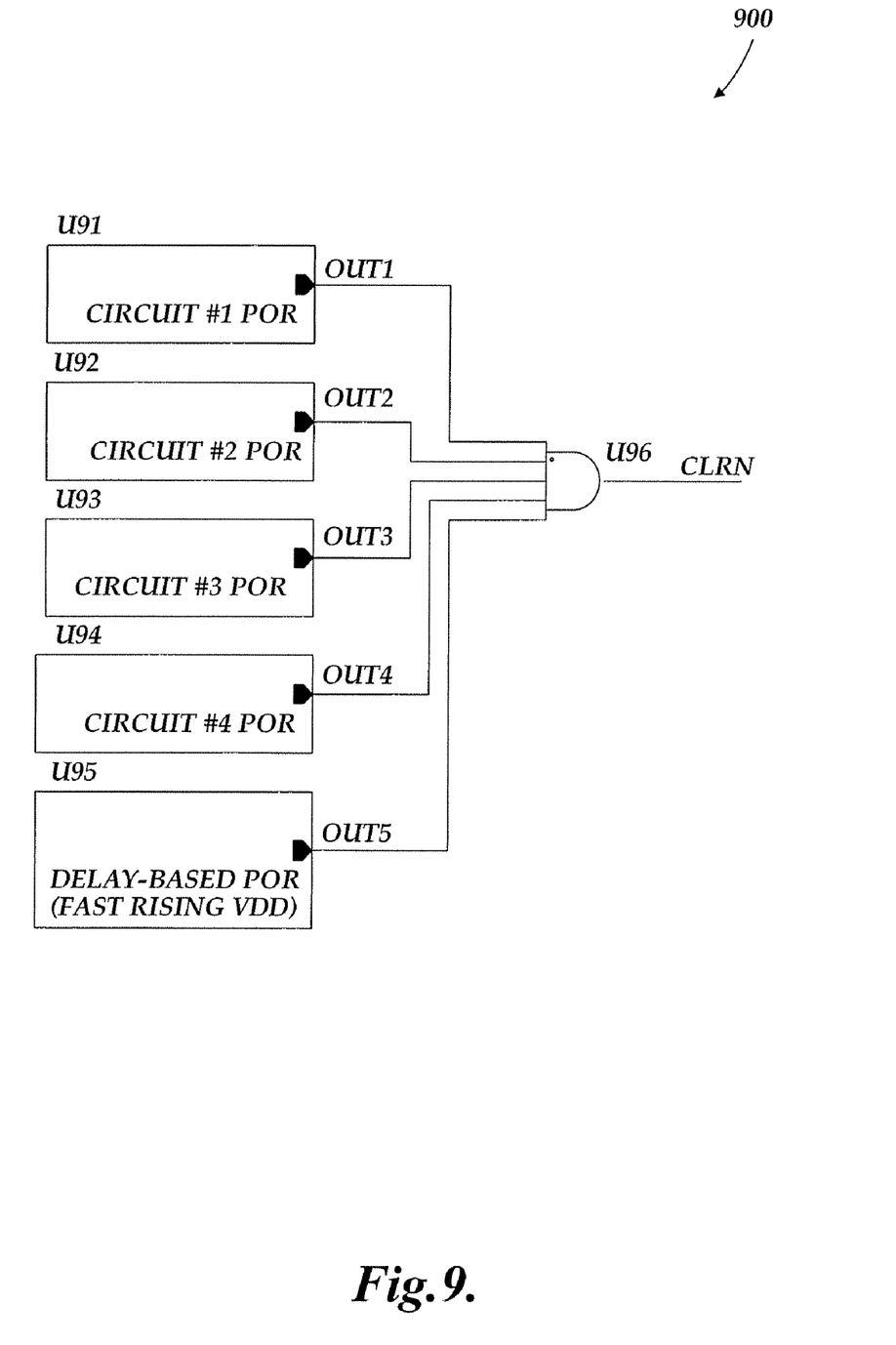
FIG. 9 is a schematic diagram of a power-on reset circuit which models four critical sub-circuits.

FIG. 9 is a schematic diagram of a power-on reset circuit 900 for four critical sub-circuits. More specifically, in a complex integrated circuit, several power-on reset circuits can be used to ensure the operation of several critical circuits. FIG. 9 shows a complete power-on reset system, where the four critical circuits have been identified and included in the voltage-based power-on reset circuits, and a time-delay power-on reset has further been added to protect against a fast rising power-on.

As shown in FIG. 9, the power-on reset circuit 900 includes power-on reset subcircuits U91, U92, U93, U94, U95, and an AND gate U96. The power-on reset circuit U95 is a time-delay based circuit, and will provide a reset pulse in the case of a fast rising power on. The outputs OUT1-OUT5 of the power-on reset circuits U91-U95 are combined by the AND gate U96, which outputs the reset signal CLRN.

Figure 10:
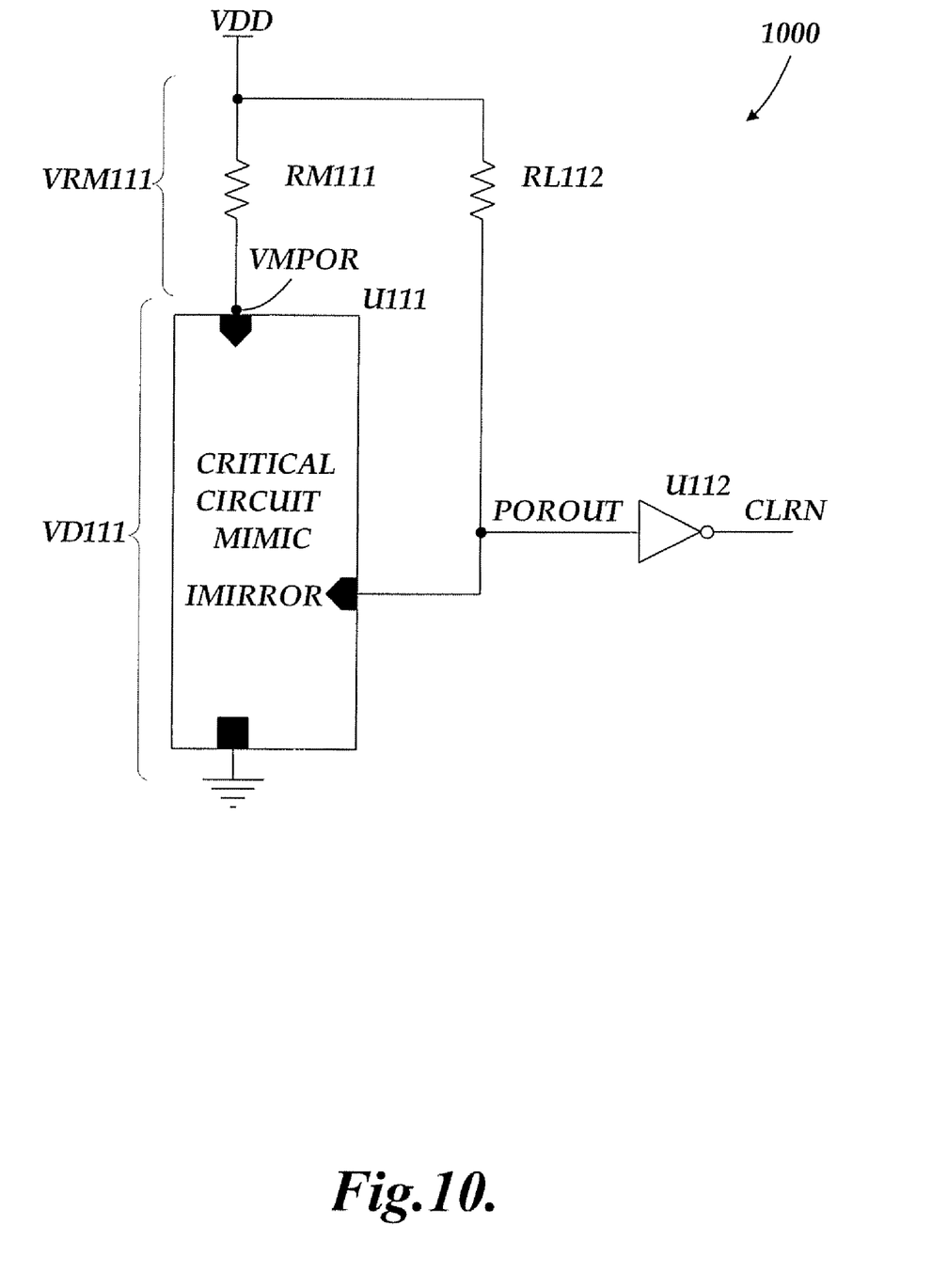
FIG. 10 is a schematic diagram of a general power-on reset circuit for modeling a general critical circuit.

FIG. 10 is a schematic diagram of a general power-on reset circuit 1000 for modeling a general critical circuit. The circuit 1000 illustrates a general version of the power-on reset circuit concept, where a mimic circuit U111 represents the structure of the critical circuit that defines the minimum safe operating supply voltage, with a current output IMIRROR to drive a load resistor RL112.

As shown in FIG. 10, the power-on reset circuit 1000 includes a margin resistor RM111, the load resistor RL112, the mimic circuit U111 and an output component U112. The margin resistor RM111 and the mimic circuit U111 are coupled in series between the power supply VDD and ground. The circuit node between the margin resistor RM111 and the mimic circuit U111 has a voltage VMPOR. A voltage drop VRM111 occurs across the margin resistor RM111, while a voltage drop VD111 occurs across the mimic circuit U111. The load resistor RL112 is coupled in series with a mirror portion (not shown) of the mimic circuit U111 between the power supply VDD and ground. The circuit node between the load resistor RL112 and the mirror portion of the mimic circuit U111 provides the output signal POROUT. The output component U112 receives the signal POROUT and outputs the reset signal CLRN.

While the preferred embodiment of the invention has been illustrated and described, numerous variations in the illustrated and described arrangements of features and sequences of operations will be apparent to one skilled in the art based on this disclosure. Thus, it will be appreciated that various changes can be made therein without departing from the spirit and scope of the invention.

The embodiments of the invention in which an exclusive property or privilege is claimed as follows:

1. A power-on-reset circuit included in an integrated circuit powered by a supply voltage, the integrated circuit having a first critical sub-circuit that is not part of the power-on-reset circuit, the first critical sub-circuit having a total critical sub-circuit operating voltage drop, the total critical sub-circuit operating voltage drop comprising at least first, second and third operating voltage drops across respective first, second and third critical sub-circuit transistor elements, the first, second and third critical sub-circuit transistor elements being coupled in series, the first, second and third critical sub-circuit transistor elements having desired operating currents that define the first, second and third voltage drops, at least one of the first, second or third critical sub-circuit transistor elements being a PMOS transistor element and at least one being an NMOS transistor element, the power-on reset circuit comprising:

first, second and third mimic transistor elements, the first, second and third mimic transistor elements being coupled in series, the first, second and third mimic transistor elements being respective PMOS or NMOS transistor elements so as to correspond to the same type of transistor elements as the respective first, second and third critical sub-circuit transistor elements; and a margin voltage drop portion, wherein:

the first, second and third mimic transistor elements provide mimic voltage drops that approximate the voltage drops across the respective first, second and third critical sub-circuit transistor elements;

the margin voltage drop portion provides a margin voltage drop; and a total mimic plus margin voltage drop of the power-on reset circuit approximates the total critical sub-circuit operating voltage drop plus the margin voltage drop during operation of the integrated circuit.

2. The power-on reset circuit of claim 1, wherein each of the first, second and third mimic transistor elements is designed to have a current density that approximates a current density of the corresponding first, second and third critical sub-circuit transistor elements.

3. The power-on reset circuit of claim 1, further comprising a plurality of mimic transistor elements in addition to the first, second and third mimic transistor elements which provide a plurality of additional mimic voltage drops.

4. The power-on reset circuit of claim 1, wherein the margin voltage drop portion comprises a resistor.

5. The power-on reset circuit of claim 1, wherein the first mimic transistor element is sized to draw less current than the first critical sub-circuit transistor element.

6. The power-on reset circuit of claim 5, wherein the first mimic transistor element is sized with a lower W/L ratio than the first critical sub-circuit transistor element so as to limit the current drain in the power-on reset circuit.

7. The power-on reset circuit of claim 1, wherein the margin voltage drop is between approximately 0.05 and 0.5 volts.

8. The power-on reset circuit of claim 7, wherein the margin voltage drop is approximately 0.1 volts.

9. The power-on reset circuit of claim 1, further comprising a reset signal portion which comprises a separate circuit branch of the power-on reset circuit and which provides a reset signal.

10. The power-on reset circuit of claim 9, wherein when the power supply voltage is at a first level, the first mimic transistor element is designed to be in a first mimic state, and the reset signal is in a first reset state, and the first critical sub-circuit is disabled, and when the power supply voltage reaches a second level, the first mimic transistor is designed to be in a second mimic state, and the reset signal is in a second reset state which allows the first critical sub-circuit to be enabled.

11. The power-on reset circuit of claim 10, wherein as the power supply voltage increases, it first passes a threshold level which causes the first mimic transistor element to switch from the first mimic state to the second mimic state, and then at a higher voltage level the power supply voltage reaches a desired operating voltage for the critical sub-circuit which corresponds to a desired operating current for the critical sub-circuit.

12. The power-on reset circuit of claim 11, wherein the reset signal is designed to not be switched to its second reset state which allows the first critical sub-circuit to be enabled until the power supply voltage reaches an even higher voltage level which also includes a margin voltage level.

13. The power-on reset circuit of claim 9, wherein the separate circuit branch of the reset signal portion comprises a mirror transistor which functions as a current mirror with respect to one of the first, second or third mimic transistor elements.

14. The power-on reset circuit of claim 13, wherein the separate circuit branch of the reset signal portion further comprises a load resistor coupled in series with the mirror transistor, a circuit node between the load resistor and the mirror transistor providing an output signal that determines the reset signal.

15. The power-on reset circuit of claim 9, wherein the reset signal portion further comprises an output component which provides the reset signal.

16. The power-on reset circuit of claim 15, wherein the output component is one of an inverter or Schmidt Trigger.

17. The power-on reset circuit of claim 15, wherein the output component comprises one or more transistors that are wider than the first mimic transistor and are thus able to operate at lower voltages.

18. The power-on reset circuit of claim 1, wherein the first critical sub-circuit comprises a plurality of critical sub-circuit transistor elements in addition to the first, second and third critical sub-circuit transistor elements, including both NMOS and PMOS transistor elements, and the power-on reset circuit further comprises a plurality of corresponding mimic transistor elements in addition to the first, second and third mimic transistor elements including both NMOS and PMOS transistor elements.

19. The power-on reset circuit of claim 18, wherein the NMOS and PMOS mimic transistor elements are in separate NMOS and PMOS mimic circuits, and the outputs of the NMOS and PMOS mimic circuits are combined by an AND gate element.

20. The power-on reset circuit of claim 18, wherein the NMOS and PMOS mimic transistor elements form an inverter type configuration.

21. The power-on reset circuit of claim 1, further comprising hysteresis components for creating different thresholds for switching the reset signal depending on whether the supply voltage is rising or falling.

22. The power-on reset circuit of claim 1, further comprising a plurality of power-on reset sub-circuits for mimicking a plurality of critical sub-circuits of the integrated circuit.

23. The power-on reset circuit of claim 22, wherein the outputs of the plurality of power-on reset sub-circuits are combined by an AND gate to form a reset signal.

24. The power-on reset circuit of claim 1, further comprising a time delay sub-circuit.

25. The power-on reset circuit of claim 1, wherein the first critical sub-circuit is an analog circuit.

26. The power-on reset circuit of claim 1, wherein the first critical sub-circuit receives differential inputs.

27. The power-on reset circuit of claim 26, wherein the gate of one of the first, second or third critical sub-circuit transistor elements receives one of the differential inputs.

28. A method of generating a power-on-reset signal in an integrated circuit powered by a supply voltage, the integrated circuit having a first critical sub-circuit that is not part of a power-on-reset circuit, the first critical sub-circuit having a total critical sub-circuit operating voltage drop, the total critical sub-circuit operating voltage drop comprising at least first, second and third operating voltage drops across respective first, second and third critical sub-circuit transistor elements, the first, second and third critical sub-circuit transistor elements being coupled in series, the first, second and third critical sub-circuit transistor elements having desired operating currents that define the first, second and third voltage drops, at least one of the first, second or third critical sub-circuit transistor elements being a PMOS transistor element and at least one being an NMOS transistor element, the method comprising:
  mimicking the voltage characteristics of the first, second and third critical sub-circuit transistor elements;
  applying the supply voltage to the mimicked voltage characteristics so as to mimic a voltage drop that approximates the voltage drop across the first, second and third critical sub-circuit transistor elements; and
  switching the power-on reset signal to enable the first critical sub-circuit when the power supply voltage is at a level at which the mimicked voltage drop is at a desired operating voltage.

29. The method of generating a power-on-reset signal of claim 28, further comprising a reset signal portion which comprises a separate circuit branch of the power-on reset circuit and which provides a reset signal.

30. The method of generating a power-on-reset signal of claim 29, wherein the separate circuit branch of the reset signal portion comprises a mirror transistor which functions as a current mirror with respect to one of the first, second or third mimic transistor elements.

31. The method of generating a power-on-reset signal of claim 30, wherein the separate circuit branch of the reset signal portion further comprises a load resistor coupled in series with the mirror transistor, a circuit node between the load resistor and the mirror transistor providing an output signal that determines the reset signal.

32. The method of generating a power-on-reset signal of claim 28, wherein the first critical sub-circuit is an analog circuit.

33. The method of generating a power-on-reset signal of claim 28, wherein the first critical sub-circuit receives differential inputs.

34. The method of generating a power-on-reset signal of claim 33, wherein the gate of one of the first, second or third critical sub-circuit transistor elements receives one of the differential inputs.

* * * * *